(12) United States Patent
Lu et al.

(10) Patent No.: US 8,867,154 B1
(45) Date of Patent: Oct. 21, 2014

(54) SYSTEMS AND METHODS FOR PROCESSING DATA WITH LINEAR PHASE NOISE PREDICTIVE FILTER

(71) Applicant: LSI Corporation, San Jose, CA (US)

(72) Inventors: Lu Lu, San Jose, CA (US); Jianzhong Huang, San Jose, CA (US); Haitao Xia, San Jose, CA (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/912,171

(22) Filed: Jun. 6, 2013

Related U.S. Application Data

(60) Provisional application No. 61/821,668, filed on May 9, 2013.

(51) Int. Cl.
| | | |
|---|---|---|
| *G11B 5/00* | (2006.01) | |
| *H03M 13/41* | (2006.01) | |
| *G11B 20/10* | (2006.01) | |
| *H03M 1/06* | (2006.01) | |

(52) U.S. Cl.
CPC ............ *H03M 1/0626* (2013.01); *H03M 13/41* (2013.01); *G11B 20/10046* (2013.01)
USPC .......................................................... 360/32

(58) Field of Classification Search
None
See application file for complete search history.

(56) References Cited

U.S. PATENT DOCUMENTS

| | | | |
|---|---|---|---|
| 5,012,245 A * | 4/1991 | Scott et al. ..................... 341/150 |
| 6,535,553 B1 | 3/2003 | Limberg et al. | |
| 7,248,630 B2 | 7/2007 | Modrie | |
| 7,257,764 B2 | 8/2007 | Suzuki | |
| 7,421,017 B2 | 9/2008 | Takatsu | |
| 7,502,189 B2 | 3/2009 | Sawaguchi | |
| 7,535,811 B2 * | 5/2009 | Tatsuzawa et al. ......... 369/59.22 |
| 7,715,471 B2 | 5/2010 | Werner | |
| 8,018,360 B2 | 9/2011 | Nayak | |
| 8,046,666 B2 | 10/2011 | Park et al. | |
| 8,208,213 B2 | 6/2012 | Liu | |
| 8,312,359 B2 * | 11/2012 | Liu et al. ........................ 714/796 |
| 8,411,537 B2 * | 4/2013 | Tan et al. .................... 369/47.14 |
| 2002/0154588 A1 * | 10/2002 | Tonami et al. .............. 369/59.22 |
| 2004/0032683 A1 * | 2/2004 | Ashley et al. ................... 360/46 |
| 2005/0117484 A1 * | 6/2005 | Tatsuzawa et al. ......... 369/53.15 |
| 2005/0141378 A1 * | 6/2005 | Tatsuzawa et al. ........... 369/53.2 |
| 2005/0264906 A1 * | 12/2005 | Haratsch ........................ 360/39 |
| 2006/0123285 A1 | 6/2006 | De Araujo | |
| 2008/0037393 A1 * | 2/2008 | Kawabe et al. ............ 369/47.17 |
| 2009/0002862 A1 | 1/2009 | Park et al. | |

(Continued)

OTHER PUBLICATIONS

U.S. Appl. No. 13/777,915, filed Feb. 26, 2013, Jun Xiao, Unpublished.
U.S. Appl. No. 13/597,046, filed Aug. 28, 2012, Lu Pan, Unpublished.

(Continued)

*Primary Examiner* — Peter Vincent Agustin
(74) *Attorney, Agent, or Firm* — Hamilton DeSanctis & Cha

(57) ABSTRACT

Systems, methods, devices, circuits for data processing, and more particularly to systems and methods for data processing with a linear phase noise predictive filter. A data processing system includes an equalizer circuit operable to filter a digital data input to yield equalized data, a linear phase noise predictive finite impulse response filter operable to filter the equalized data to yield filtered data, and a data detector circuit operable to apply a data detection algorithm to the filtered data to yield a detected output. The greatest tap coefficient for the linear phase noise predictive finite impulse response filter is at a center tap.

20 Claims, 4 Drawing Sheets

(56) References Cited

U.S. PATENT DOCUMENTS

| | | | |
|---|---|---|---|
| 2009/0180368 A1* | 7/2009 | Miyashita et al. | 369/53.35 |
| 2009/0268575 A1* | 10/2009 | Tan et al. | 369/53.41 |
| 2010/0067621 A1 | 3/2010 | Noeldner | |
| 2011/0072335 A1 | 3/2011 | Liu et al. | |
| 2011/0075569 A1 | 3/2011 | Marrow | |
| 2011/0164332 A1 | 7/2011 | Cao | |
| 2011/0164669 A1* | 7/2011 | Mathew et al. | 375/227 |
| 2011/0167227 A1 | 7/2011 | Yang et al. | |
| 2012/0019946 A1 | 1/2012 | Aravind | |
| 2012/0056612 A1 | 3/2012 | Mathew | |
| 2012/0069891 A1 | 3/2012 | Zhang | |
| 2012/0089657 A1* | 4/2012 | Yang et al. | 708/323 |
| 2012/0124119 A1 | 5/2012 | Yang | |
| 2012/0236430 A1 | 9/2012 | Tan | |
| 2013/0054664 A1* | 2/2013 | Chang et al. | 708/323 |
| 2013/0128374 A1* | 5/2013 | Christensen et al. | 360/40 |
| 2013/0326316 A1* | 12/2013 | Wu et al. | 714/800 |
| 2013/0339827 A1* | 12/2013 | Han et al. | 714/799 |

OTHER PUBLICATIONS

U.S. Appl. No. 13/562,140, filed Jul. 30, 2012, Haotian Zhang, Unpublished.
U.S. Appl. No. 13/742,336, filed Jan. 15, 2013, Jianzhong Huang, Unpublished.
U.S. Appl. No. 13/551,507, filed Jul. 17, 2012, Ming Jin, Unpublished.
U.S. Appl. No. 13/545,784, filed Jul. 10, 2012, Yu Liao, Unpublished.
U.S. Appl. No. 13/525,188, filed Jun. 15, 2012, Yang Han, Unpublished.
U.S. Appl. No. 13/525,182, filed Jun. 15, 2012, Yang Han, Unpublished.
U.S. Appl. No. 13/346,556, filed Jan. 9, 2012, Haitao Xia, Unpublished.
U.S. Appl. No. 13/272,209, filed Oct. 12, 2011, Yu Liao, Unpublished.
U.S. Appl. No. 13/239,719, filed Sep. 22, 2011, Haitao Xia, Unpublished.
U.S. Appl. No. 13/491,062, filed Jun. 7, 2012, Jin Lu, Unpublished.

* cited by examiner

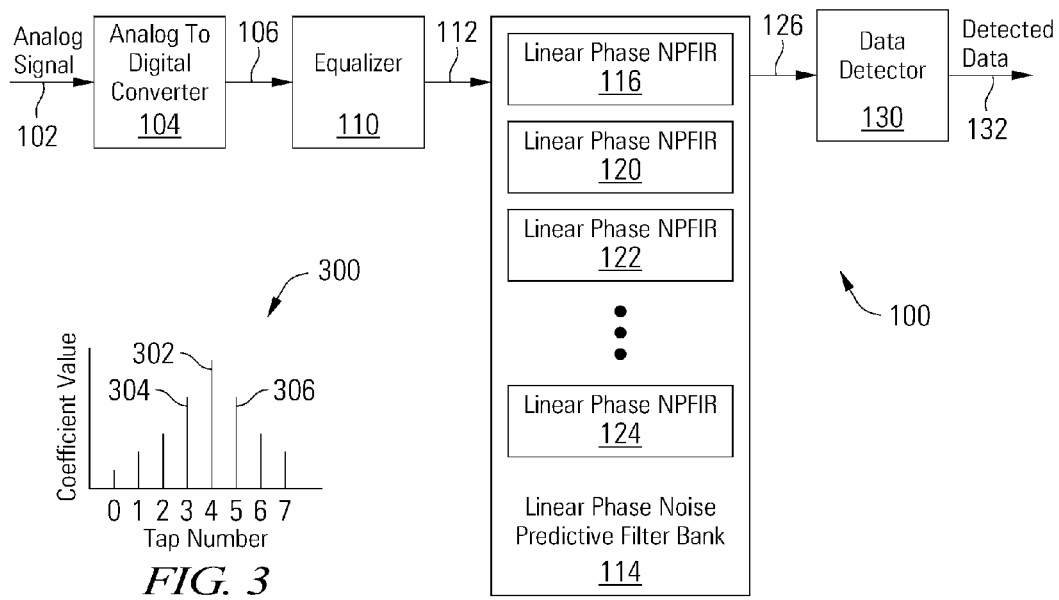
FIG. 3
FIG. 1
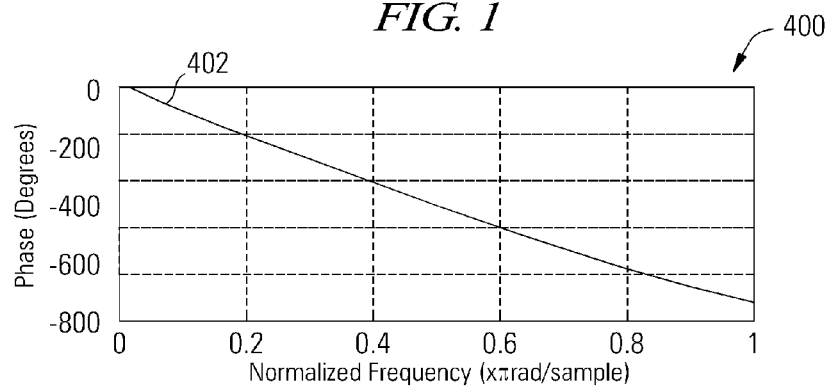
FIG. 4
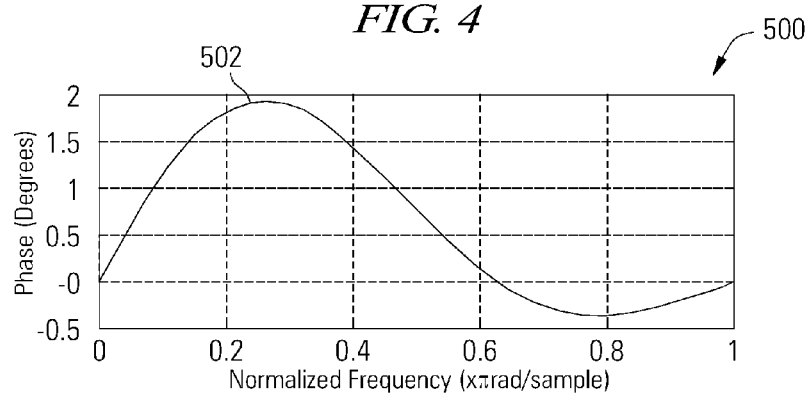
FIG. 5

SYSTEMS AND METHODS FOR PROCESSING DATA WITH LINEAR PHASE NOISE PREDICTIVE FILTER

CROSS REFERENCE TO RELATED APPLICATIONS

The present application claims priority to (is a non-provisional of) U.S. Pat. App. No. 61/821,668, entitled "Systems and Methods for Processing Data With Linear Phase Noise Predictive Filter", and filed May 9, 2013 by Lu et al, the entirety of which is incorporated herein by reference for all purposes.

FIELD OF THE INVENTION

Various embodiments of the present invention provide systems and methods for data processing, and more particularly to systems and methods for data processing with a linear phase noise predictive filter.

BACKGROUND

Data processing circuits often include a data detector circuit and a data decoder circuit. In some cases many passes through both the data detector circuit and the data decoder circuit in an attempt to recover originally written data. One of the main causes limiting the ability to recover originally written data is media noise corrupting information received from a channel. To limit the effects of media noise, the data processing circuit may include a noise predictive filter circuit to predict potential noise corruption. However, phase distortion in noise predictive filter circuits reduces the effectiveness of the filtering.

SUMMARY

A data processing system is disclosed including an equalizer circuit operable to filter a digital data input to yield equalized data, a linear phase noise predictive finite impulse response filter operable to filter the equalized data to yield filtered data, and a data detector circuit operable to apply a data detection algorithm to the filtered data to yield a detected output. The greatest tap coefficient for the linear phase noise predictive finite impulse response filter is at a center tap.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. This summary provides only a general outline of some embodiments of the invention. Additional embodiments are disclosed in the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals may be used throughout several drawings to refer to similar components.

In the figures, like reference numerals are used throughout several figures to refer to similar components.

FIG. 1 depicts a data processing system with linear phase noise predictive filtering in accordance with some embodiments of the present invention;

FIG. 3 is a chart of tap coefficient values in a linear phase noise predictive finite impulse response filter in accordance with some embodiments of the present invention;

FIG. 4 is a plot of phase versus frequency for a linear phase noise predictive finite impulse response filter in accordance with some embodiments of the present invention;

FIG. 5 is a plot of phase versus frequency for a non-linear phase noise predictive finite impulse response filter;

DETAILED DESCRIPTION OF THE INVENTION

Figure 2:
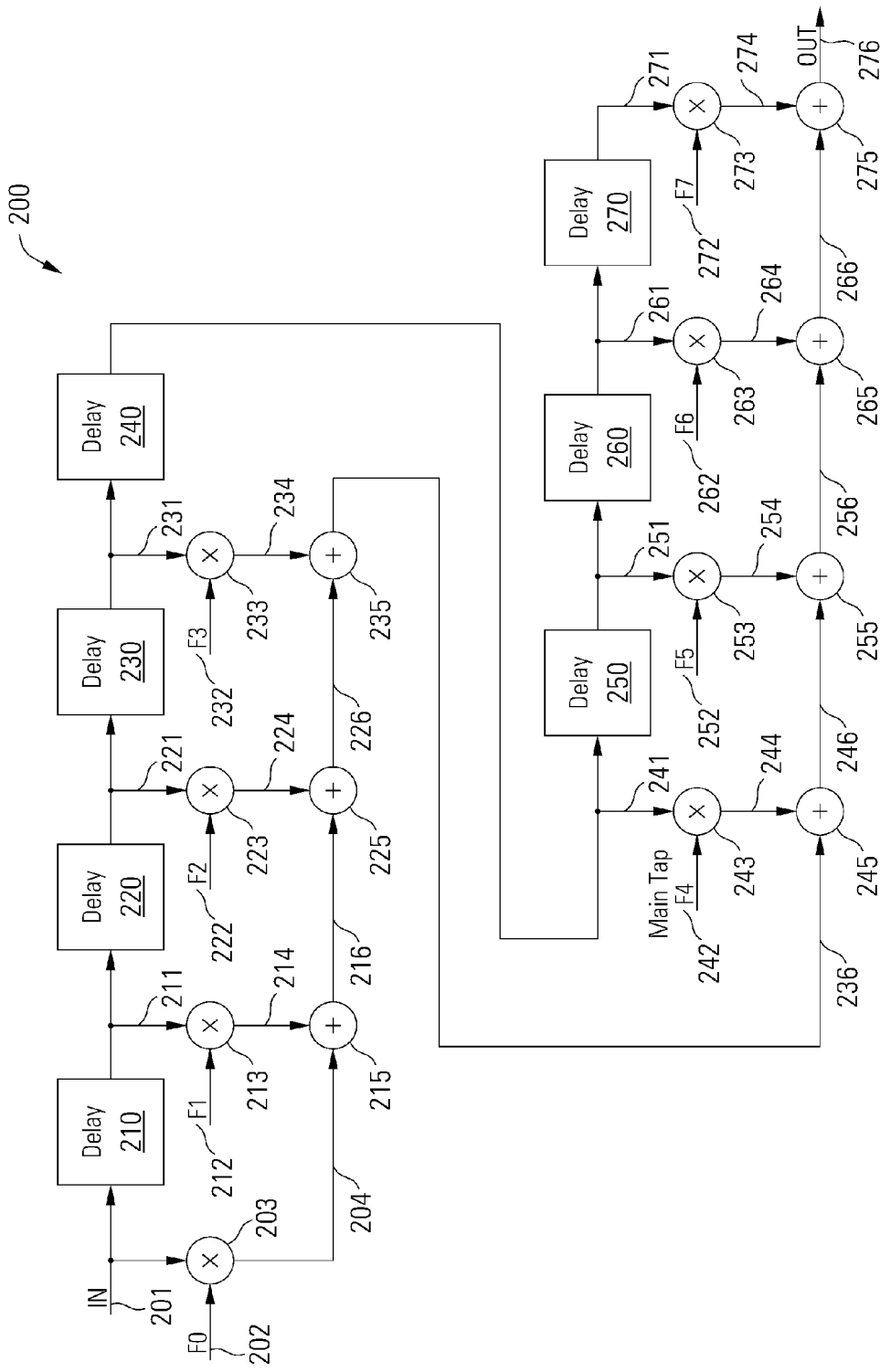
FIG. 2 depicts a linear phase noise predictive finite impulse response filter in accordance with some embodiments of the present invention.

Various embodiments of the present invention provide for data processing that includes filtering in a linear phase noise predictive finite impulse response (NPFIR) filter, along with a data detection and data decoding process. The noise predictive finite impulse response filter includes in some embodiments both causal and non-causal taps, with a center tap selected as the main tap position, and with a sufficient number of taps to result in a linear phase. As used herein, the term "non-causal" is used in its broadest sense to mean any condition where at least post occurrence information is used to determine a current occurrence. In contrast, the term "causal" implies a condition where only pre-occurrence and/or current occurrence information is used to determine a current occurrence. Thus, as an example, a non-causal circuit may rely on the following five data inputs $i_{-2}$, $i_{-1}$, $i_0$, $i_{+1}$, $i_{+2}$, where $i_{-2}$ occurs two bit periods prior to the current occurrence, $i_{-1}$ occurs one bit period prior to the current occurrence, $i_0$ is the current occurrence, $i_{-1}$ occurs one bit period after the current occurrence, and $i_{+2}$ occurs two bit periods after the current occurrence. In contrast, a causal circuit may rely on the following five data inputs $i_{-4}$, $i_{-3}$, $i_{-2}$, $i_{-1}$, $i_0$, where $i_{-4}$ occurs four bit periods prior to the current occurrence, where $i_{-3}$ occurs three bit periods prior to the current occurrence, where $i_{-2}$ occurs two bit periods prior to the current occurrence, $i_{-1}$ occurs one bit period prior to the current occurrence, and $i_0$ is the current occurrence. Based upon the disclosure provided herein, one of ordinary skill in the art will recognize a variety of data sets upon which an anti-causal noise predictive filter circuit may operate in accordance with different embodiments of the present invention. In some embodiments of the present invention, a non-causal noise predictive filter is used that relies on one or more future noise samples to estimate a current noise level (e.g., $n_{+1}$, where $n_{+1}$ is a noise sample occurring one bit period after the current noise sample $n_0$).

For the linear phase noise predictive finite impulse response filter disclosed herein, both causal and non-causal taps are used, using both past noise samples and future noise samples.

The linear phase noise predictive finite impulse response filter also has the main tap located in the center tap position, with sufficient taps to result in a linear phase. In some embodiments, the linear phase noise predictive finite impulse response filter includes eight taps, although other numbers of taps are used in other embodiments. For filters with an odd number of taps, the center tap is the main tap, or the tap with the largest tap coefficient. For filters with an even number of taps, the later of the two center taps is the main tap.

Turning to FIG. 1, a data processing system 100 with linear phase noise predictive filtering is depicted in accordance with some embodiments of the present invention. Data processing system 100 includes an analog to digital converter 104 that receives an analog signal 102. In some embodiments, analog input signal 102 is derived from a read/write head assembly (not shown) that is disposed in relation to a magnetic storage medium (not shown). Analog to digital converter 104 converts analog input signal 102 into a corresponding series of digital samples 106. Analog to digital converter 104 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention.

Digital samples 106 are provided to an equalizer circuit 110. Equalizer circuit 110 applies an equalization algorithm to digital samples 106 to yield an equalized output 112. In some embodiments of the present invention, equalizer circuit 110 is a digital finite impulse response filter circuit as are known in the art.

Equalized output 112 is provided to a linear phase noise predictive finite impulse response filter bank 114, which includes a number of selectable linear phase noise predictive finite impulse response filters 116, 120, 122, 124 to yield filtered samples 126. The selectable linear phase noise predictive finite impulse response filters 116, 120, 122, 124 are configured with different sets of tap coefficients based on different predicted noise conditions. This allows the selection of a filter to be quickly changed based on the data pattern in equalized output 112, customizing the filtering in linear phase noise predictive finite impulse response filter bank 114 to noise conditions specific to the input data pattern, and without having to re-configure an individual linear phase noise predictive finite impulse response filter with new tap coefficients.

In some embodiments in which a 16-state trellis-based data detector 130 processes the filtered samples 126, the states in data detector 130 are selected based on 4-bit input data patterns in filtered samples 126. The linear phase noise predictive finite impulse response filter bank 114 is accordingly adapted based on 4-bit input data patterns in equalized output 112, with different sets of tap coefficients calculated for each 4-bit input data pattern. For example, it is expected that different noise conditions will occur for a data pattern of '0000' and a data pattern of '0010' because of the different transition patterns in the two data patterns. Tap coefficients are therefore adapted based on the different noise predictions for each pattern, resulting in two different sets of tap coefficients. One of the sets will be applied to one linear phase noise predictive finite impulse response filter (e.g., 116) in bank 114, and the other of the sets will be applied to another linear phase noise predictive finite impulse response filter (e.g., 120) in bank 114. When input data pattern '0000' is identified in equalized output 112, the corresponding linear phase noise predictive finite impulse response filter (e.g., 116) is selected, and when input data pattern '0010' is identified in equalized output 112, the corresponding linear phase noise predictive finite impulse response filter (e.g., 120) is selected.

In some embodiments, the number of linear phase noise predictive finite impulse response filters included in bank 114 is reduced by grouping polarity symmetrical data patterns. For example, data patterns '0000' and '1111' have the same number of transitions and can be expected to result in similar noise conditions, and are therefore assigned to the same linear phase noise predictive finite impulse response filter (e.g., 116) with one set of tap coefficients adapted using either or both data patterns '0000' and '1111'. Similarly, data patterns '0101' and '1010' are inverse patterns that have the same number of transitions in the same locations and can be expected to result in similar noise conditions, and are therefore assigned to the same linear phase noise predictive finite impulse response filter (e.g., 122) with one set of tap coefficients adapted using either or both data patterns '0101' and '1010'. In some such embodiments, with a 16-state data detector 130, eight linear phase noise predictive finite impulse response filters (e.g., 116, 120, 122, 124) are provided in linear phase noise predictive finite impulse response filter bank 114.

The filtered samples 126 are provided to data detector 130 which applies a data detection algorithm to filtered samples 126 to yield detected data 132. The data detection algorithm may be any trellis based data detection algorithm known in the art. As examples, the data detection algorithm may be, but is not limited to, a Viterbi data detection algorithm or a maximum a posteriori data detection algorithm are known in the art. Based upon the disclosure provided herein, one of ordinary skill in the art will recognize a variety of data detection algorithms that may be used in relation to different embodiments of the present invention.

An example linear phase noise predictive finite impulse response filter 200 that may be used in place of the linear phase noise predictive finite impulse response filters 116, 120, 122, 124 in linear phase noise predictive finite impulse response filter bank 114 is disclosed in FIG. 2. The linear phase noise predictive finite impulse response filter 200 applies a mathematical operation to a digital data stream at input 201 to achieve any of a wide range of desired frequency responses at output 266. The linear phase noise predictive finite impulse response filter 200 is noise predictive because the filter or tap coefficients are tuned based on the expected noise.

As illustrated in FIG. 2, the linear phase noise predictive finite impulse response filter 200 passes input 201 through a series of delay elements 210, 220, 230, 240, 250, 260 and 270, multiplying the delayed signals by filter coefficients or tap weights 202, 212, 222, 232, 242, 252, 262 and 272, and summing the results to yield a filtered output 276. The outputs 211, 221, 231, 241, 251, 261 and 271 of each delay element 210, 220, 230, 240, 250, 260 and 270 and the input 201 form a tapped delay line and are referred to as taps. The number of delay elements 210, 220, 230, 240, 250, 260 and 270, and thus the number of taps 201, 211, 221, 231, 241, 251, 261 and 271 (also referred to as the order or length of the filter 200) may be increased to more finely tune the frequency response, but at the cost of increasing complexity. The linear phase noise predictive finite impulse response filter 200 implements a filtering equation such as $Y[n]=F_0X[n]+F_1X[n-1]+F_2X[n-2]+F_3X[n-3]+F_4X[n-4]+F_5X[n-5]+F_6X[n-6]+F_7X[n-7]$ for the eight-tap filter illustrated in FIG. 2, or more generally $Y[n]=F_0X[n]+F_1X[n-1]+F_2X[n-2]+ \ldots +F_3X[n-L]$, where X is the input 102, the value subtracted from n represents the index or delay applied to each term, $F_i$ are the tap coefficients 202, 212, 222, 232, 242, 252, 262 and 272, Y[n] is the output 266 and L is the filter order. In one example embodiment, to include both causal and non-causal taps, tap coefficients $F_0$ 202 through $F_3$ 232 are causal taps based on future noise samples and tap coefficients $F_4$ 242 through $F_7$ 272 are non-causal taps based on past noise samples. Because the linear phase noise predictive finite impulse response filter 200 has an even number of taps, the later 241 of the middle two taps 231 and 241 is the main tap, corresponding with tap coefficient $F_4$ 242 which has the largest tap coefficient value.

The input 201 is multiplied by tap coefficient 202 in a multiplier 203, yielding a first output term 204. The second tap 211 is multiplied by tap coefficient 212 in multiplier 213, yielding a second output term 214, which is combined with first output term 204 in an adder 215 to yield a first sum 216. The third tap 221 is multiplied by tap coefficient 222 in multiplier 223, yielding a second output term 224, which is combined with first output term 216 in an adder 225 to yield sum 226. The fourth tap 231 is multiplied by tap coefficient 232 in multiplier 233, yielding output term 234, which is combined with sum 226 in adder 235 to yield sum 236. The fifth tap 241 is multiplied by tap coefficient 242 in multiplier 243, yielding output term 244, which is combined with sum 236 in adder 245 to yield sum 246. The sixth tap 251 is multiplied by tap coefficient 252 in multiplier 253, yielding output term 254, which is combined with sum 246 in adder 255 to yield sum 256. The seventh tap 261 is multiplied by tap coefficient 262 in multiplier 263, yielding output term 264, which is combined with sum 256 in adder 265 to yield sum 266. The eighth tap 271 is multiplied by tap coefficient 272 in multiplier 273, yielding output term 274, which is combined with sum 266 in adder 275 to yield output 276. By changing the tap coefficients 202, 212, 222, 232, 242, 252, 262 and 272, the filtering applied to the input 201 by the linear phase noise predictive finite impulse response filter 200 is adjusted to select the desired pass frequencies and stop frequencies.

Turning to FIG. 3, a chart 300 shows the distribution of tap coefficient values in an eight-tap linear phase noise predictive finite impulse response filter in accordance with some embodiments of the present invention. Again, for a linear phase noise predictive finite impulse response filter with an even number of taps, the later of the two middle taps, in this case tap 4, is selected as the main tap and is given the greatest tap coefficient 302. The values of the surrounding tap coefficients (e.g., 304, 306) drop lower as a function of distance from the main tap. In some cases, the distribution of tap coefficient values forms a bell type curve or Gaussian distribution as shown in FIG. 3, although the linear phase noise predictive finite impulse response filter is not limited to this distribution of tap coefficient values.

The larger the number of taps, the better the filter performance. By providing a sufficient number of taps, such as, but not limited to, eight taps, so that filter performance is not substantially limited by the number of taps, and by including both causal and non-causal taps with the main tap at the center, the noise predictive finite impulse response filter has a substantially linear phase. Such a linear phase 402 is shown in the phase versus frequency plot 400 of FIG. 4, in contrast with the non-linear phase 502 shown in the phase versus frequency plot 500 of FIG. 5 that results from placing the main tap at the first or last tap and using only causal or non-causal taps.

Figure 6:
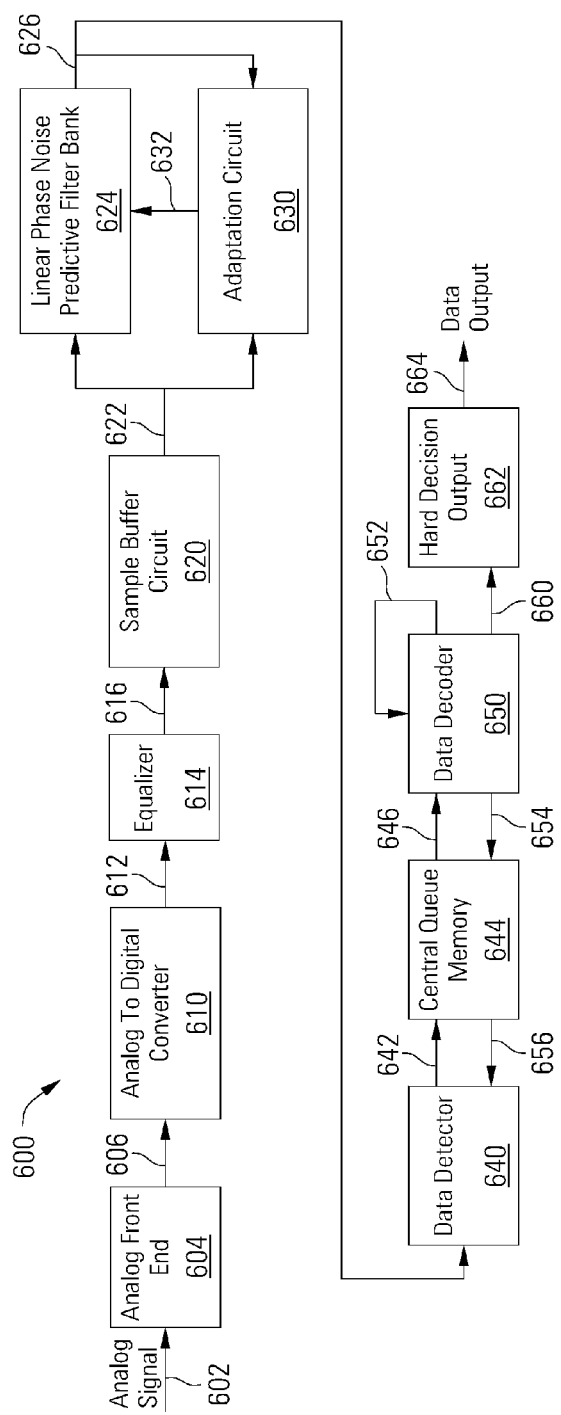
FIG. 6 depicts a read channel with linear phase noise predictive filtering in accordance with some embodiments of the present invention.

Turning to FIG. 6, a read channel 600 with a linear phase noise predictive filter bank 624 is used to process an analog signal 602 and to retrieve user data bits from the analog signal 602 without errors. In some cases, analog signal 602 is derived from a read/write head assembly in a magnetic storage medium. In other cases, analog signal 602 is derived from a receiver circuit that is operable to receive a signal from a transmission medium. The transmission medium may be wireless or wired such as, but not limited to, cable or optical connectivity. Based upon the disclosure provided herein, one of ordinary skill in the art will recognize a variety of sources from which analog signal 602 may be derived.

The read channel 600 includes an analog front end 604 that receives and processes the analog signal 602. Analog front end 604 may include, but is not limited to, an analog filter and an amplifier circuit as are known in the art. Based upon the disclosure provided herein, one of ordinary skill in the art will recognize a variety of circuitry that may be included as part of analog front end 604. In some cases, the gain of a variable gain amplifier included as part of analog front end 604 may be modifiable, and the cutoff frequency and boost of an analog filter included in analog front end 604 may be modifiable. Analog front end 604 receives and processes the analog signal 602, and provides a processed analog signal 606 to an analog to digital converter 610.

Analog to digital converter 610 converts processed analog signal 606 into a corresponding series of digital samples 612. Analog to digital converter 610 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 612 are provided to an equalizer 614. Equalizer 614 applies an equalization algorithm to digital samples 612 to yield an equalized output 616. In some embodiments of the present invention, equalizer 614 is a digital finite impulse response filter circuit as is known in the art. Equalizer 614 ensures that equalized output 616 has the desired spectrum for data detector 640.

The equalized output 616 is provided to a sample buffer circuit for storage until data detector 640 is available. Stored samples 622 are then provided to a linear phase noise predictive filter bank 624 which includes a number of selectable linear phase noise predictive finite impulse response filters. Each filter in linear phase noise predictive filter bank 624 is configured with a set of tap coefficients which are applied to incoming data to yield filtered samples 626. The linear phase noise predictive filter bank 624 thus includes a number of linear phase noise predictive finite impulse response filters and a selector circuit such as a multiplexer that selects or enables one of the filters based on the pattern in the input data from stored samples 622. This allows the selection of a filter to be quickly changed based on the data pattern in stored samples 622, customizing the filtering in linear phase noise predictive finite impulse response filter bank 624 to noise conditions specific to the input data pattern, and without having to re-configure an individual linear phase noise predictive finite impulse response filter with new tap coefficients.

In some embodiments in which a 16-state trellis-based data detector 640 processes the filtered samples 626, the linear phase noise predictive filter bank 624 includes eight filters, each having eight taps configured with different sets of coefficients which have been adapted based on 4-bit input data patterns in stored samples 622. Inverse patterns, or polarity symmetric patterns, such as '1010' and '0101' share a common filter with the same tap coefficients in some embodiments to reduce the number of filters in linear phase noise predictive filter bank 624.

An adaptation circuit 630 generates filter tap coefficient sets 632 for the linear phase noise predictive filter bank 624 based on the stored samples 622 and on the filtered samples

626. cleaned data samples 218 (or buffered data 244) and on the Y samples 236. In some embodiments, the adaptation circuit 630 is a least mean squares error calculation circuit operable to generate filter coefficients that reduce an error signal based on the stored samples 622 and filtered samples 626. Tap coefficient adaptation in the adaptation circuit 630 may also be based on a hard decision output 660 from a data decoder 650, using the hard decision output 660 as the known data value used to generate an error signal. Based upon the disclosure provided herein, one of ordinary skill in the art will recognize a variety of error signal generation circuits that may be included as part of adaptation circuit 630 to generate tap coefficient sets 632. Tap coefficients may be generated in adaptation circuit 630 based on training data or known data, calculating tap coefficient values that increase the ability of the linear phase noise predictive filter bank 624 to filter out noise and result in correct data values. Different sets of tap coefficients are generated in the adaptation circuit 630 for each input data pattern or pair of polarity symmetrical input data patterns.

The filtered samples 626 are provided to data detector 640 which applies a data detection algorithm to filtered samples 626 to yield detected data 642. Data detector 640 is a circuit capable of producing detected output 642 by applying a data detection algorithm. In some embodiments, the data detection algorithm may be but is not limited to, a soft output Viterbi algorithm (SOVA), or a maximum a posteriori detection algorithm as are known in the art. Based upon the disclosure provided herein, one of ordinary skill in the art will recognize a variety of data detection algorithms that may be used in relation to different embodiments of the present invention. Data detector 640 may provide both hard decisions and soft decisions. The terms "hard decisions" and "soft decisions" are used in their broadest sense. In particular, "hard decisions" are outputs indicating an expected original input value (e.g., a binary '1' or '0', or a non-binary digital value), and the "soft decisions" indicate a likelihood that corresponding hard decisions are correct. Based upon the disclosure provided herein, one of ordinary skill in the art will recognize a variety of hard decisions and soft decisions that may be used in relation to different embodiments of the present invention.

Detected output 642 is provided to a central queue memory 644 that operates to buffer data passed between data detector 640 and data decoder 650. When data decoder 650 is available, data decoder 650 receives detected output 642 from central queue memory 644 as a decoder input 646. Data decoder 650 applies a data decoding algorithm to decoder input 646 in an attempt to recover originally written data. The result of the data decoding algorithm is provided as a decoded output 654. Similar to detected output 642, decoded output 654 may include both hard decisions and soft decisions. Data decoder 650 may be any data decoder circuit known in the art that is capable of applying a decoding algorithm to a received input. Data decoder 650 may be, but is not limited to, a low density parity check decoder circuit or a Reed Solomon decoder circuit as are known in the art. Based upon the disclosure provided herein, one of ordinary skill in the art will recognize a variety of data decoder circuits that may be used in relation to different embodiments of the present invention. Where the original data is recovered (i.e., the data decoding algorithm converges) or a timeout condition occurs, data decoder 650 provides the result of the data decoding algorithm as a data output 660. Data output 660 is provided to a hard decision output circuit 662 where the data is reordered before providing a series of ordered data sets as a data output 664.

One or more iterations through the combination of data detector 640 and data decoder 650 may be made in an effort to converge on the originally written data set. Processing through both the data detector 640 and the data decoder 650 is referred to as a "global iteration". For the first global iteration, data detector 640 applies the data detection algorithm without guidance from a decoded output. For subsequent global iterations, data detector 640 applies the data detection algorithm to filtered samples 626 as guided by decoded output 654. Decoded output 654 is received from central queue memory 644 as a detector input 656.

During each global iteration it is possible for data decoder 650 to make one or more local iterations including application of the data decoding algorithm to decoder input 646. For the first local iteration, data decoder 650 applies the data decoder algorithm without guidance from a decoded output 652. For subsequent local iterations, data decoder 650 applies the data decoding algorithm to decoder input 646 as guided by a previous decoded output 652. In some embodiments of the present invention, a default of ten local iterations is allowed for each global iteration.

Figure 7:
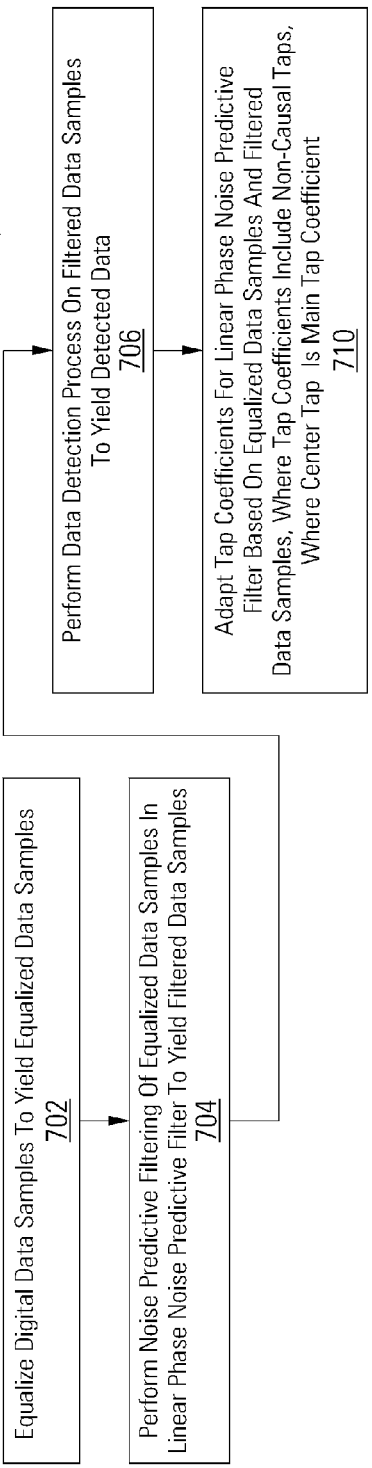
FIG. 7 is a flow diagram showing a method for processing data with a linear phase noise predictive finite impulse response filter in accordance with some embodiments of the present invention.

Turning to FIG. 7, a flow diagram 700 discloses a method for processing data with a linear phase noise predictive finite impulse response filter in accordance with some embodiments of the present invention. Following flow diagram 700, digital data samples are equalized to yield equalized data samples. (Block 702) The equalization is performed in some embodiments using a digital finite impulse response filter. Noise predictive filtering of equalized data samples is performed in a linear phase noise predictive finite impulse response filter to yield filtered data samples. (Block 704) The noise predictive filtering is performed using a linear phase function in a linear phase noise predictive finite impulse response filter disclosed herein.

The linear phase noise predictive finite impulse response filter has the main tap located in the center tap position, with sufficient taps to result in a substantially linear phase without substantial distortion. In some embodiments, the linear phase noise predictive finite impulse response filter includes eight taps, although other numbers of taps are used in other embodiments. For filters with an odd number of taps, the center tap is the main tap, or the tap with the largest tap coefficient. For filters with an even number of taps, the later of the two center taps is the main tap. The linear phase noise predictive finite impulse response filter also includes both causal and non-causal taps.

In some embodiments, the filtering is performed using a bank of the linear phase noise predictive finite impulse response filters to rapidly provide different filter characteristics adapted to the particular input data pattern without reconfiguring the tap coefficients of a single filter. Once the tap coefficients are adapted for the bank of filters, one of the filters in the bank is selected for each block of input data to the bank, for example, for every 4 input bits in a system with a 16 state data detector. The number of filters in the bank is reduced in some embodiments by sharing one filter with a particular set of tap coefficients for each polarity symmetrical pair of input data patterns.

A data detection process is performed on the filtered data samples from the linear phase noise predictive finite impulse response filter to yield detected data. (Block 706) Additional processing may be performed, such as, but not limited to, a data decoding process. Tap coefficients for the linear phase noise predictive filter are adapted based on equalized data samples and filtered data samples, where tap coefficients include non-causal taps, and where center tap is main tap coefficient. (Block 710) Again, the tap coefficients are adapted to place the greatest tap coefficient at the center tap.

Figure 8:
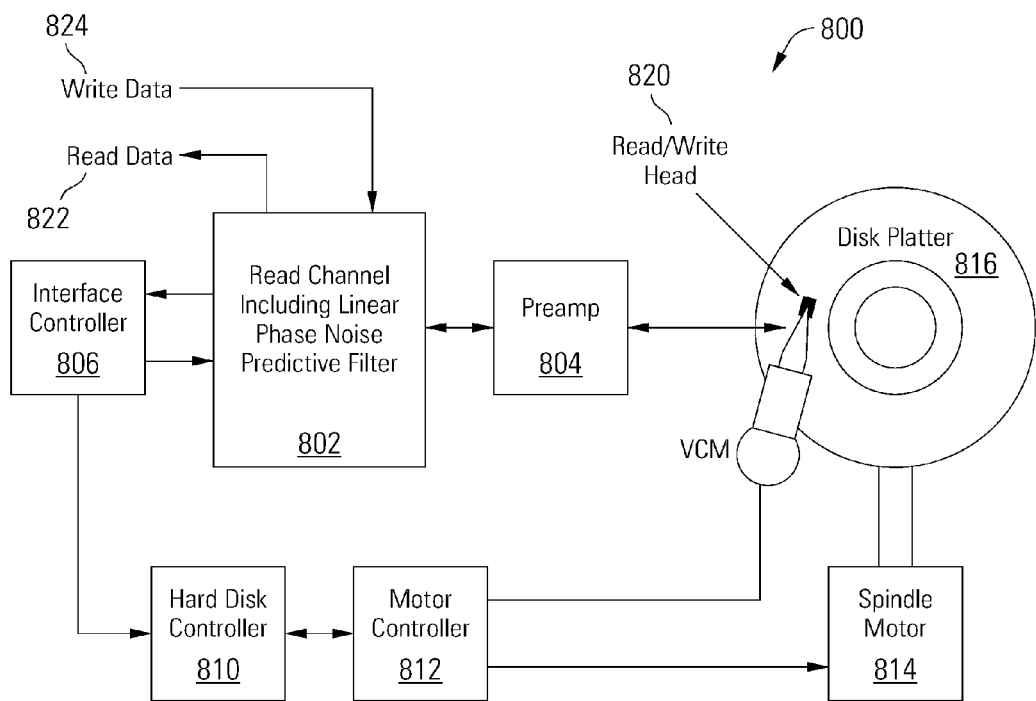
FIG. 8 depicts a storage system including a read channel with a linear phase noise predictive finite impulse response filter in accordance with some embodiments of the present invention.

Turning to FIG. 8, a storage system 800 is illustrated as an example application of a data processing system with a linear phase noise predictive finite impulse response filter in accordance with some embodiments of the present invention. The storage system 800 includes a read channel circuit 802 with a data processing system with a linear phase noise predictive finite impulse response filter in accordance with some embodiments of the present invention. Storage system 800 may be, for example, a hard disk drive. Storage system 800 also includes a preamplifier 804, an interface controller 806, a hard disk controller 810, a motor controller 812, a spindle motor 814, a disk platter 816, and a read/write head assembly 820. Interface controller 806 controls addressing and timing of data to/from disk platter 816. The data on disk platter 816 consists of groups of magnetic signals that may be detected by read/write head assembly 820 when the assembly is properly positioned over disk platter 816. In one embodiment, disk platter 816 includes magnetic signals recorded in accordance with either a longitudinal or a perpendicular recording scheme.

In a typical read operation, read/write head assembly 820 is accurately positioned by motor controller 812 over a desired data track on disk platter 816. Motor controller 812 both positions read/write head assembly 820 in relation to disk platter 816 and drives spindle motor 814 by moving read/write head assembly 820 to the proper data track on disk platter 816 under the direction of hard disk controller 810. Spindle motor 814 spins disk platter 816 at a determined spin rate (RPMs). Once read/write head assembly 820 is positioned adjacent the proper data track, magnetic signals representing data on disk platter 816 are sensed by read/write head assembly 820 as disk platter 816 is rotated by spindle motor 814. The sensed magnetic signals are provided as a continuous, minute analog signal representative of the magnetic data on disk platter 816. This minute analog signal is transferred from read/write head assembly 820 to read channel circuit 802 via preamplifier 804. Preamplifier 804 is operable to amplify the minute analog signals accessed from disk platter 816. In turn, read channel circuit 802 decodes and digitizes the received analog signal to recreate the information originally written to disk platter 816. This data is provided as read data 822 to a receiving circuit. While processing the read data, read channel circuit 802 processes the received signal using a linear phase noise predictive finite impulse response filter. Such a linear phase noise predictive finite impulse response filter may be implemented consistent with that disclosed above in relation to FIGS. 1-4 and 6. In some cases, the data processing may be performed consistent with the flow diagram disclosed above in relation to FIG. 7. A write operation is substantially the opposite of the preceding read operation with write data 824 being provided to read channel circuit 802. This data is then encoded and written to disk platter 816.

It should be noted that storage system 800 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 800, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

In addition, it should be noted that storage system 800 may be modified to include solid state memory that is used to store data in addition to the storage offered by disk platter 816. This solid state memory may be used in parallel to disk platter 816 to provide additional storage. In such a case, the solid state memory receives and provides information directly to read channel circuit 802. Alternatively, the solid state memory may be used as a cache where it offers faster access time than that offered by disk platter 816. In such a case, the solid state memory may be disposed between interface controller 806 and read channel circuit 802 where it operates as a pass through to disk platter 816 when requested data is not available in the solid state memory or when the solid state memory does not have sufficient storage to hold a newly written data set. Based upon the disclosure provided herein, one of ordinary skill in the art will recognize a variety of storage systems including both disk platter 816 and a solid state memory.

Figure 9:
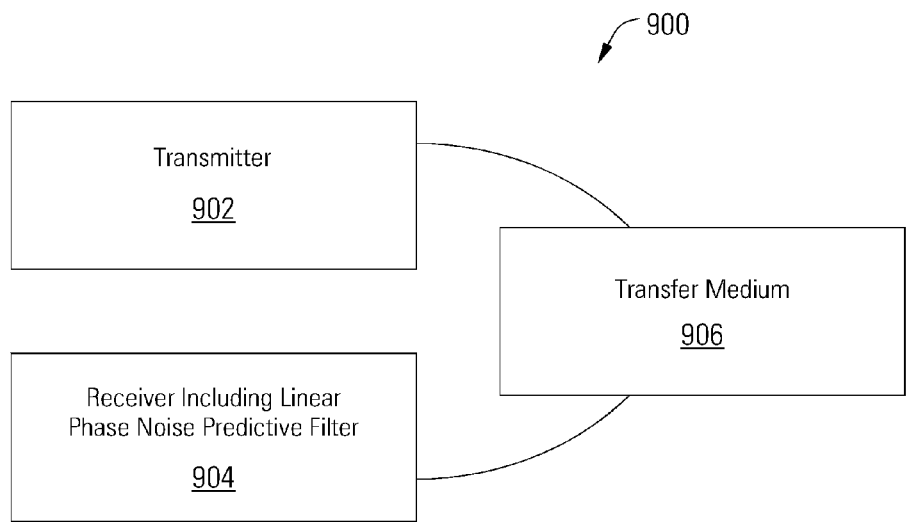
FIG. 9 depicts a wireless communication system using a linear phase noise predictive finite impulse response filter in accordance with some embodiments of the present invention.

Turning to FIG. 9, a wireless communication system 900 or data transmission device including a transmitter 902 and receiver 904 with a linear phase noise predictive finite impulse response filter is shown in accordance with some embodiments of the present invention. Communication system 900 includes a transmitter 902 that is operable to transmit encoded information via a transfer medium 906 as is known in the art. The encoded data is received from transfer medium 906 by receiver 904. Receiver 904 incorporates a linear phase noise predictive finite impulse response filter. Such a linear phase noise predictive finite impulse response filter may be implemented consistent with the disclosure above in relation to FIGS. 1-4 and 6. In some cases, the data processing may be performed consistent with the flow diagram disclosed above in relation to FIG. 7.

Linear phase noise predictive finite impulse response filtering technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as dynamic random-access memory, negated-AND flash, negated-OR flash, other non-volatile memories and solid state drives.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel systems, devices, methods and arrangements for data processing with a linear phase noise predictive finite impulse response filter. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system comprising:
an equalizer circuit operable to filter a digital data input to yield equalized data;
a linear phase noise predictive finite impulse response filter operable to filter the equalized data to yield filtered data, wherein a greatest tap coefficient for the linear phase noise predictive finite impulse response filter is at a center tap, wherein the linear phase noise predictive finite impulse response filter comprises an even number of taps, and wherein the center tap comprises a later of two middle taps in the even number of taps; and
a data detector circuit operable to apply a data detection algorithm to the filtered data to yield a detected output.

2. The data processing system of claim 1, wherein the linear phase noise predictive finite impulse response filter comprises both causal and non-causal taps.

3. The data processing system of claim 1, wherein the linear phase noise predictive finite impulse response filter comprises eight taps, and wherein the center tap is at the fifth tap.

4. The data processing system of claim 1, wherein the linear phase noise predictive finite impulse response filter comprises a substantially linear phase as a function of frequency.

5. The data processing system of claim 1, wherein the linear phase noise predictive finite impulse response filter comprises a bank of linear phase noise predictive finite impulse response filters, each with a different set of tap coefficients adapted to a different input pattern, operable to select among the linear phase noise predictive finite impulse response filters in the bank based on an input data pattern.

6. The data processing system of claim 5, wherein at least some of the linear phase noise predictive finite impulse response filters in the bank are selected for either of two input data patterns that are polarity symmetrical inverses of each other.

7. The data processing system of claim 1, further comprising a tap adaptation circuit operable to generate tap coefficients for the linear phase noise predictive finite impulse response filter based in part on the equalized data and on a signal derived from an output of the linear phase noise predictive finite impulse response filter.

8. The data processing system of claim 1, further comprising an analog to digital converter circuit operable to convert an input signal into the digital data input.

9. The data processing system of claim 1, wherein the data detection algorithm applied by the data detector circuit comprises a soft output Viterbi algorithm.

10. The data processing system of claim 1, further comprising a data decoder circuit operable to decode the detected output to yield a hard decision output, wherein tap coefficients for the linear phase noise predictive finite impulse response filter are adapted based at least in part on the hard decision output.

11. The data processing system of claim 1, wherein the system is implemented as an integrated circuit.

12. The data processing system of claim 1, wherein the data processing system is implemented as part of a data storage device.

13. The data processing system of claim 1, wherein the data processing system is implemented as part of a transmission system.

14. A method for data processing, comprising:
equalizing a digital data input to yield equalized data;
performing noise predictive filtering on the equalized data with a linear phase function to yield filtered data;
applying a data detection algorithm to the filtered data to yield a detected output; and
generating finite impulse response tap coefficients to be used in the noise predictive filtering based in part on the equalized data and on a signal derived from the filtered data, wherein a largest of the finite impulse response tap coefficients corresponds with a center tap, and wherein the center tap comprises a later of two middle taps in an even number of taps for a linear phase noise predictive finite impulse response filter.

15. The method of claim 14, wherein generating finite impulse response tap coefficients comprises generating eight tap coefficients with the fifth of the eight tap coefficients being the largest of the finite impulse response tap coefficients.

16. The method of claim 14, wherein the finite impulse response tap coefficients are generated with both causal and non-causal inputs.

17. The method of claim 14, wherein performing the noise predictive filtering comprise filtering in a bank of linear phase noise predictive finite impulse response filters.

18. A storage device, comprising:
a storage medium;
a head assembly disposed in relation to the storage medium and operable to provide a sensed signal corresponding to a data set on the storage medium; and
a read channel circuit including:
an analog to digital converter operable to sample the sensed signal to yield digital data samples;
an equalizer circuit operable to filter the digital data samples to yield equalized data;
a linear phase noise predictive finite impulse response filter operable to filter the equalized data to yield filtered data, wherein a greatest tap coefficient for the linear phase noise predictive finite impulse response filter is at a center tap, wherein the linear phase noise predictive finite impulse response filter comprises an even number of taps, and wherein the center tap comprises a later of two middle taps in the even number of taps; and
a data detector circuit operable to apply a data detection algorithm to the filtered data to yield a detected output.

19. The storage device of claim 18, wherein the linear phase noise predictive finite impulse response filter comprises eight taps, and wherein the center tap is at the fifth tap.

20. The storage device of claim 18, further comprising a data decoder circuit operable to decode the detected output to yield a hard decision output, wherein tap coefficients for the linear phase noise predictive finite impulse response filter are adapted based at least in part on the hard decision output.

* * * * *